(12) United States Patent
Luo et al.

US011880056B2

(10) Patent No.: US 11,880,056 B2
(45) Date of Patent: Jan. 23, 2024

(54) FLATTOP LASER BEAM GENERATION AND RESHAPING ON AN OBLIQUE SCREEN USING LIGHT PIPES

(71) Applicant: Pavilion Integration Corporation, San Jose, CA (US)

(72) Inventors: Ningyi Luo, San Jose, CA (US); Jihchuang Robin Huang, San Jose, CA (US)

(73) Assignee: Pavilion Integration Corporation, San Jose, CA (US)

( * ) Notice: Subject to any disclaimer, the term of this patent is extended or adjusted under 35 U.S.C. 154(b) by 0 days.

(21) Appl. No.: 17/995,710

(22) PCT Filed: Jun. 26, 2022

(86) PCT No.: PCT/IB2022/055918
§ 371 (c)(1),
(2) Date: Oct. 14, 2022

(87) PCT Pub. No.: WO2022/269577
PCT Pub. Date: Dec. 29, 2022

(65) Prior Publication Data
US 2023/0141759 A1    May 11, 2023

Related U.S. Application Data

(60) Provisional application No. 63/215,438, filed on Jun. 26, 2021.

(51) Int. Cl.
*G02B 21/06* (2006.01)
*F21V 8/00* (2006.01)
*F21V 5/04* (2006.01)

(52) U.S. Cl.
CPC .............. *G02B 6/0008* (2013.01); *F21V 5/04* (2013.01); *G02B 21/06* (2013.01)

(58) Field of Classification Search
CPC .. G02B 6/0008; G02B 21/06; G02B 27/0927; G02B 27/0994; G02B 21/082; G02B 6/04; F21V 5/04; H01S 5/005
(Continued)

(56) References Cited

U.S. PATENT DOCUMENTS 10,379,291 B2    8/2019  Sakamoto
2013/0258469 A1*  10/2013  Park ..................... G02B 5/04
                                                            359/834
(Continued)

FOREIGN PATENT DOCUMENTS

EP    3767365 A1 *   1/2021  .............. F21V 5/043
JP    2015111177 A    6/2015
KR    20190091098 A   8/2019

OTHER PUBLICATIONS

International Search Report dated Oct. 7, 2022 in application No. PCT/IB2022/055918.
(Continued)

*Primary Examiner* — Balram T Parbadia
*Assistant Examiner* — Rahman Abdur
(74) *Attorney, Agent, or Firm* — Oppedahl Patent Law Firm LLC

(57) ABSTRACT

A high power uniform light beam is generated on an oblique plane by one or more diode lasers and 2 or more light pipes. The light pipes may be trapezoidal so that the illuminated area is substantially square. The light pipes may be elliptical so that the illuminated area is substantially circular.

24 Claims, 6 Drawing Sheets

(58) Field of Classification Search
USPC .......................................................... 359/385
See application file for complete search history.

(56) References Cited

U.S. PATENT DOCUMENTS

| | | |
|---|---|---|
| 2018/0316160 A1 | 11/2018 | Raring |
| 2020/0259307 A1 | 8/2020 | Sharma |
| 2021/0156526 A1 | 5/2021 | Chen |

OTHER PUBLICATIONS

Written Opinion dated Oct. 7, 2022 in application No. PCT/IB2022/055918.

* cited by examiner

FLATTOP LASER BEAM GENERATION AND RESHAPING ON AN OBLIQUE SCREEN USING LIGHT PIPES

This application claims priority from U.S. patent application No. 63/215,438 filed 26 Jun. 2021, which application is incorporated herein by reference.

BACKGROUND

In high-throughput optical fluorescence applications, the system usually consists of a detection/observation module, a large sample area, and a high-power light source. The detector can be a high-resolution microscope optics. The sample area could be larger than 10 mm×10 mm. The high-power light source is a laser. The microscope optics is usually located in the normal direction to the sample area to have optimal optical image quality. This leaves the light from laser to be incident at the sample, in an off-normal direction and sometimes in a steep angle to avoid obstruction by the objective. The large incidence angle creates a slant intensity distribution. As the sample area increases, the high to low ratio (HLR) of intensity from top to bottom gets worse which limits the throughput of the system depending on the acceptable HLR. It is necessary to improve the HLR in the light beam to improve the system throughput.

The general goal is to provide a sample area where a sample of interest is located. The sample area, as mentioned, may be as large as 10 mm×10 mm or larger. The sample area may be square. A detection/observation module is aimed at the sample area. The detection/observation module may be a high-resolution microscope. Usually it is very desirable to point the detection/observation module directly at the sample area, by which we mean that its axis is normal to (perpendicular to) the plane of the sample area. It is, of course, necessary to illuminate the sample area with suitable illumination. It is often desired that the sample area be illuminated very brightly, with very little of the light going to waste outside of the sample area that is being viewed by the detection/observation module. It is further often desired that the sample area be illuminated very uniformly, so that the difference between intensity of illumination at places of highest illumination and intensity of illumination at places of lowest illumination is minimized. We can define a figure of merit as HLR or "high to low ratio" which characterizes the degree of success in minimizing such differences of intensity across the sample area being illuminated.

One of the constraints, however, in the design of such an arrangement, as mentioned above, is that there is usually very little choice but to provide the illumination from some axis that is not the same as the axis of the detection/observation module, and indeed from an axis that is quite oblique therefrom. A moment's consideration of this circumstance prompts a realization that there can be at least two potentially undesirable consequences of such off-axis illumination. A first very undesirable consequence is that some parts of the illuminated sample area are more brightly illuminated than other parts of the illuminated sample area. A second potentially undesirable consequence is that the beam profile is distorted in shape, with some of the light going to waste due to a failure of the shape of the beam profile to match the area being addressed by the detection/observation module.

It would be desirable if an approach could be devised by which a high-power light beam could be generated on a plane, with the beam being uniform in intensity across a sample area, notwithstanding the plane being oblique to the axis of the light beam. Said differently, it would be desirable if the HLR could be made close to unity. It would further be desirable if the approach could provide a light beam providing illumination with a shape matching an area being addressed by a detection/observation module such as a microscope. If, for example, the area being addressed by the detection/observation module were square, it would be desirable if the shape of the high-intensity beam of light could likewise be square.

SUMMARY OF THE INVENTION

A high-power uniform light beam is generated on an oblique plane by one or more diode lasers and two or more light pipes. The light pipes may be trapezoidal so that the illuminated area is square.

DETAILED DESCRIPTION

As will be described, this invention utilizes specially designed light pipes to produce a laser light beam with an HLR of approximately 1, incident on a target plane that is at an oblique angle relative to the axis of the light pipes. The non-uniform distributed laser light sources are first fed into specially designed light pipes. In each light pipe, the light is scrambled by multiple internal reflection and exits the light pipe at its exit aperture with a uniform intensity distribution. Following the light pipes in the optical path, an imaging lens is used to project the shape of the exit aperture onto the oblique plane.

Figure 3:
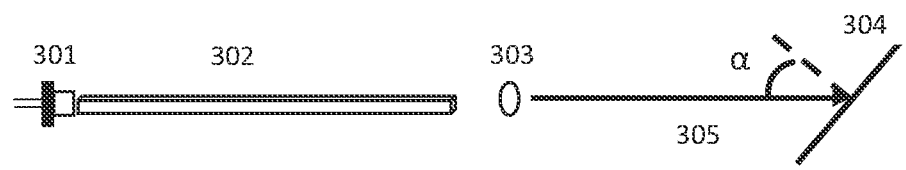
FIG. 3 shows an image projection with a light pipe directed at an oblique angle to a target plane.

We can begin by modeling what goes wrong when a single light pipe is employed such as that depicted in FIG. 3. Due to the oblique incident angle ($\alpha$), the light distribution is no longer uniform. In simple calculation, the light intensity on the screen is proportional to $$\sim (L \cdot \cos(\alpha)/\cos(\alpha+\theta))-2,$$

where L is the distance from the lens to the screen center, $\alpha$ is the screen tilting angle from normal direction, and $\theta$ is the light ray angle measured from the normal direction. (Due to the large magnification used in the setup, the distance from the light pipe exit face to the lens can be ignored.) If the screen is tilted by, say, 55 degrees from normal relative to the light-pipe axis, the light intensity at the upper edge where angle $\theta=10$ degrees would fall to about 55% of the central intensity. At the lower edge of angle $\theta=-10$ degrees, the intensity increases to 150%. The HLR is thus about 1:0.37.

As will be described, the invention overcomes this problem by selecting multiple light pipes of different shapes and injecting particular ratios of laser powers to improve the HLR. At least two light pipes with proper laser power ratios are utilized to improve the light distribution on the oblique imaging plane.

Figure 1:
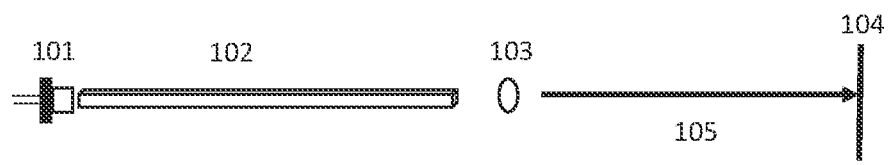
FIG. 1 shows an image projection with a light pipe directed normal to a target plane.

FIG. 1 shows a standard image projection, where the output beam from a square cross-section light pipe is incident on a screen located normal to the beam. It will be appreciated that this geometry is not used in actual detection/observation situations, because in actual detection/observation situations, it is the detection/observation module that would have its axis normal to the screen. We discuss FIG. 1 simply to show what would happen if one were to have the luxury of being able to aim the illumination apparatus directly at (normal to) the screen.

Figure 2:
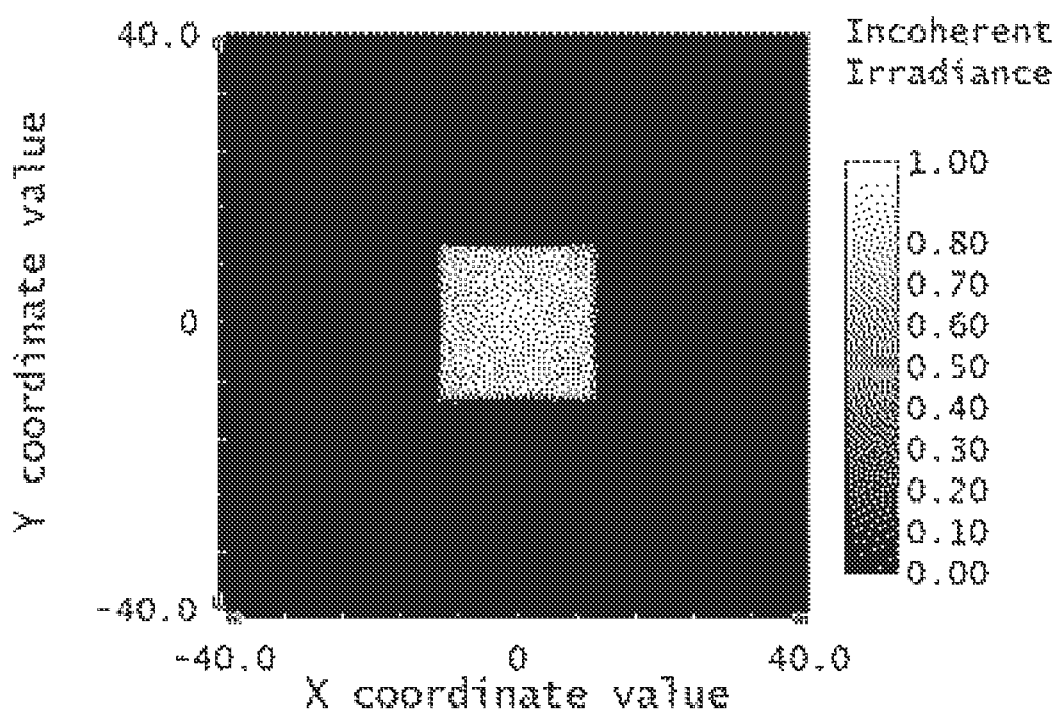
FIG. 2 shows a projected beam profile resulting from the arrangement of FIG. 1.

In FIG. 1, the light output of a diode laser (101) with Gaussian distribution is collected by a 1 mm square light pipe (102) of length 50 mm. The imaging lens (103) projects the output aperture of the light pipe to a screen (104) which is normal to the direction of the light path (105). The projected beam profile is shown in FIG. 2. In this example, a 20× magnification is used and the image on the screen (104) is a uniform 20 mm×20 mm square profile. Such a square illuminated area would be ideal for illuminating a sample area in a case where the detection/observation module is designed to address a square area. It bears emphasis that the illumination is uniform across the entire square area. The HLR is very close to unity. But it is not possible to put the detection/observation module and the illumination apparatus in the same physical location, on the same axis. So the illumination approach of FIG. 1 is not workable.

We thus permit the detection/observation module to maintain its (highly desirable) normal orientation relative to the plane of the sample area, and we reposition the illumination apparatus to an oblique angle relative to the sample area. This is depicted in FIG. 3. The other way to characterize the change is to say that we have tilted the screen (the plane of the sample area) so that it is at an angle relative to the optical path of the illumination apparatus. If we characterize things this way, then of course we say that we have also tilted the detection/observation module's axis correspondingly to preserve its normal orientation relative to the plane of the sample area.

Figure 4:
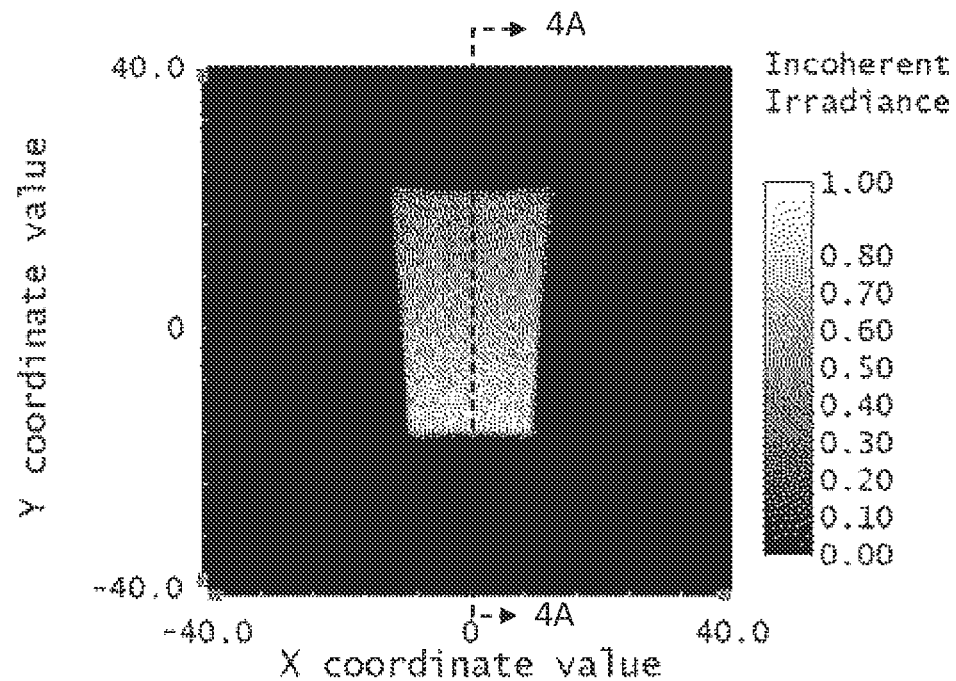
FIG. 4 shows a projected beam profile resulting from the arrangement of FIG. 3.

When the screen is tilted by an angle $\alpha$ relative to the optical path (305) as shown in FIG. 3, the projected image outline on screen (304) becomes distorted as shown in FIG. 4. By this we mean that what had previously (in FIG. 2) been a square area of illumination becomes a non-square area of illumination (in FIG. 4). The x:y ratio in FIG. 4 is about 1/1.8 or worse.

Figure 5:
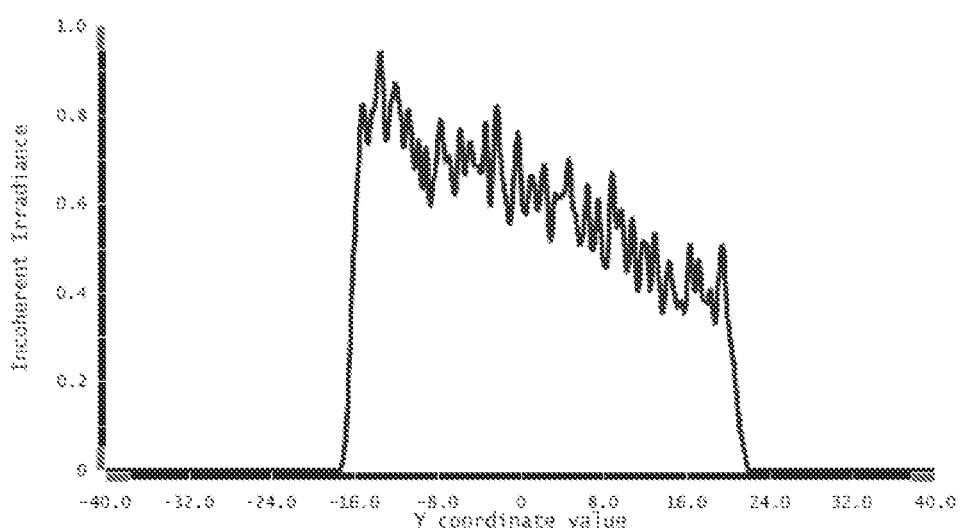
FIG. 5 shows an intensity cross section across section 4A in FIG. 4.

A ray-tracing simulation permits a high-confidence modeling of a light intensity cross section across line 4A in FIG. 4. The light intensity is shown in FIG. 5. The intensity cross section (4A) in the y direction (at x=0) becomes slanted as shown in FIG. 5. The HLR is about 1:0.45. In plain language, the least brightly illuminated places in the lit-up trapezoid of FIG. 4 (which are toward the top of FIG. 4) are only about 45% as bright as the most brightly illuminated places (which are toward the bottom of FIG. 4). What we see is that indeed both of the undesirable consequences mentioned above in the discussion of the background are seen to occur.

We can now discuss a first step in the direction of trying to address the undesirable consequences of the off-normal-axis illumination. A first step is to try to arrive at an illuminated area that is square, so that it matches the square shape of the area addressed by the detection/observation module.

Figure 6:
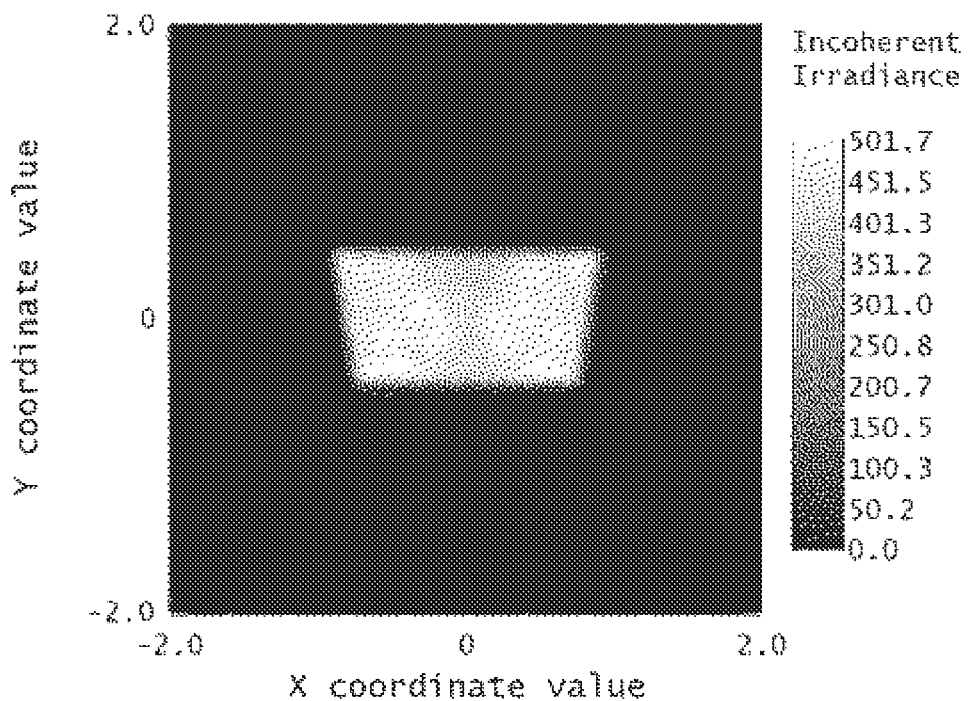
FIG. 6 shows a trapezoidal light pipe cross section intended to invert the distortions seen in FIG. 4 when employed at an oblique angle as seen in FIG. 3.
Figure 7:
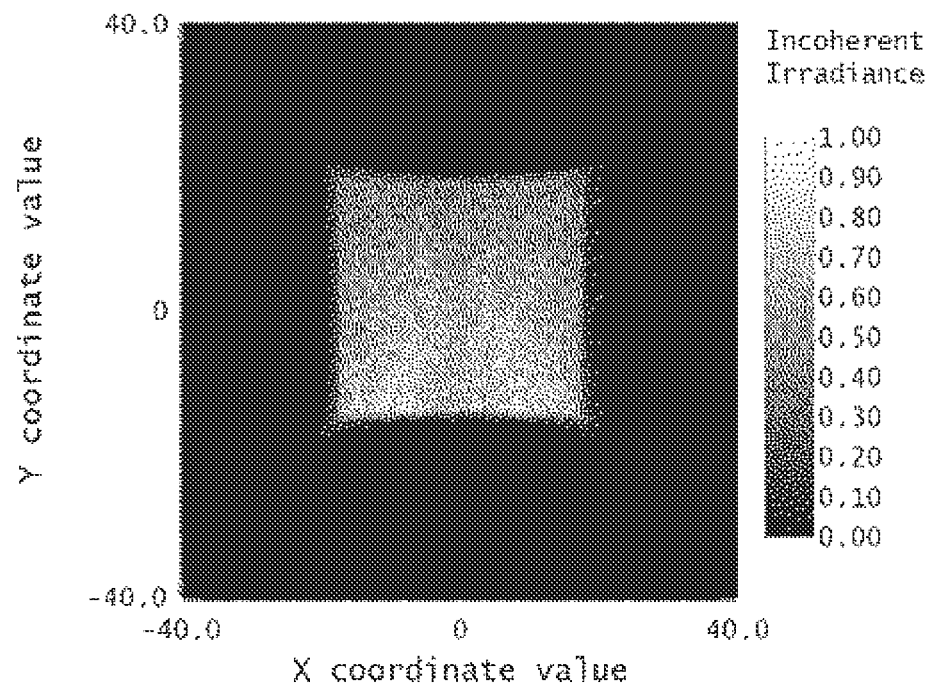
FIG. 7 shows a simulated image resulting from the trapezoidal light pipe of FIG. 6.

In order to correct the shape distortion, a light pipe with trapezoid shape and specific size is chosen, as seen in FIG. 6. A trapezoid having a long side of 1.8 mm, a short side of 1.5 mm and a height of 0.9 mm is shown. Its x:y ratio in FIG. 6 is about 1.8, selected to be the inverse of the value found in the distorted profile of the illuminated area in FIG. 4. With this shape as seen in FIG. 6, the image profile of the illuminated area on the sample screen is restored to nearly square. FIG. 7 shows is the simulated image of the illuminated area from such a light pipe.

What may be immediately appreciated by the alert reader, however, is that the HLR is not near unity, and so the HLR needs improvement. In FIG. 7, the alert reader appreciates that the illuminated area toward the bottom of FIG. 7 is much more brightly illuminated than the illuminated area toward the top of FIG. 7. One way to describe this is that there is a slanted power distribution in the y direction in FIG. 7.

Figure 8:
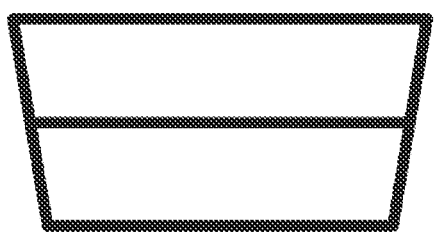
FIG. 8 shows two trapezoidal light pipes.

In order to correct the slanted power distribution in the y direction, multiple light pipes with differing power levels are used. One example is using two trapezoid light pipes in parallel as shown in FIG. 8. The smaller light pipe, below in FIG. 8, has a short side of 1:5 mm and a long side of 1.65 mm. The larger light pipe, above in FIG. 8, has a short side of 1.65 mm and a long side of 1.8 mm. Each of the two light pipes has a height of 0.45 mm.

In the example of FIG. 8, the power (the amount of light being pumped into each of the two light pipes) is carefully adjusted to a ratio of 1:1.24 as between the upper and lower trapezoids.

One way to choose such a ratio is to return to FIG. 4 and to measure the area above y=0 and the area below y=0 in that figure. The ratio of those two areas is about 1.24.

Figure 9:
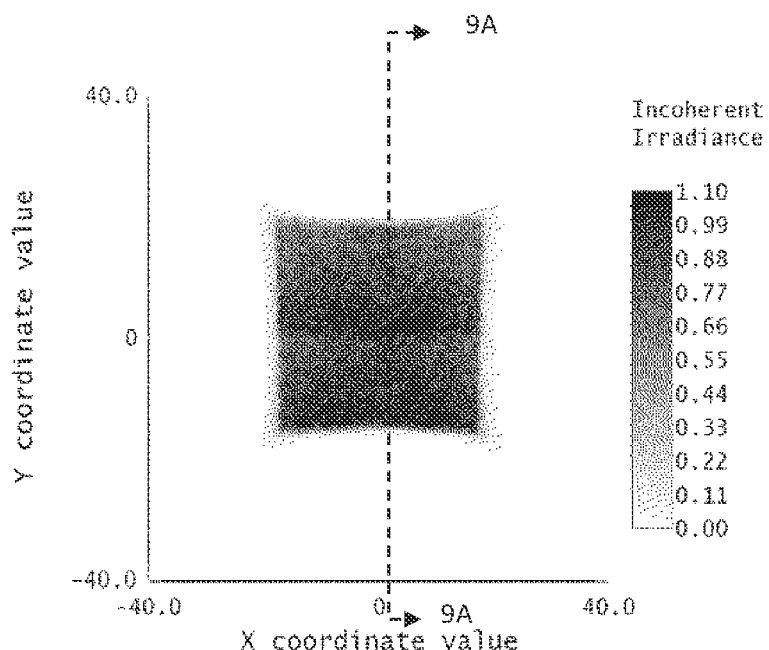
FIG. 9 shows a dated image resulting from the light-pipe arrangement of FIG. 8.
Figure 10:
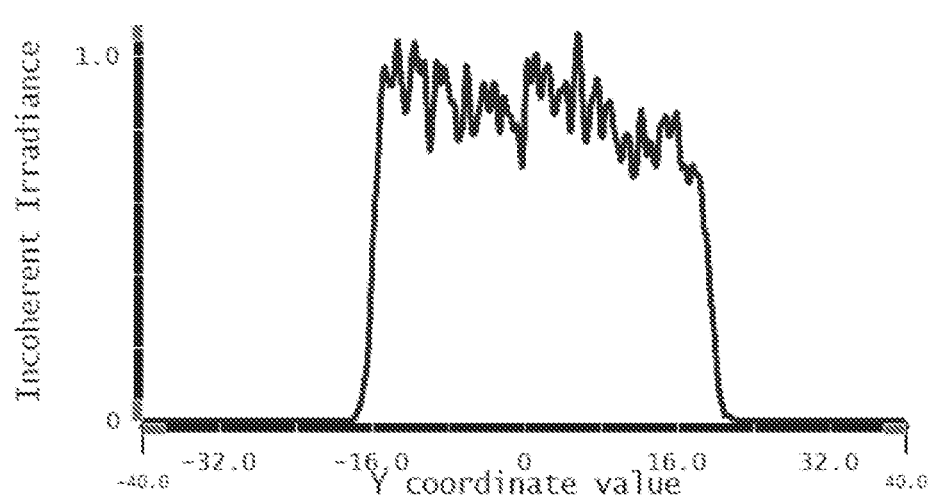
FIG. 10 shows an intensity cross section across section 9A in FIG. 9.

Similarly to the discussion above with FIGS. 4 and 5, a ray-tracing simulation permits a high-confidence modeling of a light intensity cross section across line 9A in FIG. 9. The light intensity is shown in FIG. 10. What is observed is that the HLR is improved to be about 1:0.75 as shown in FIG. 10. This is a great improvement as compared with the situation depicted in FIG. 5.

The laser power division can be achieved by translating the light source relative to the light pipe. The laser power in the upper trapezoid is varied from 0% to 100% when the light source position is initially aligned to the lower trapezoid and gradually shifted toward upper one. The laser power measurement can be done by monitoring the image plane using a laser camera which is available from many manufacturers. The other method to achieve the proper laser power ratio is using two separated light sources. Each source uses its own power driver.

Figure 11:
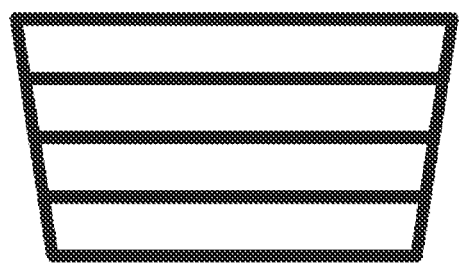
FIG. 11 shows four trapezoidal light pipes.
Figure 12:
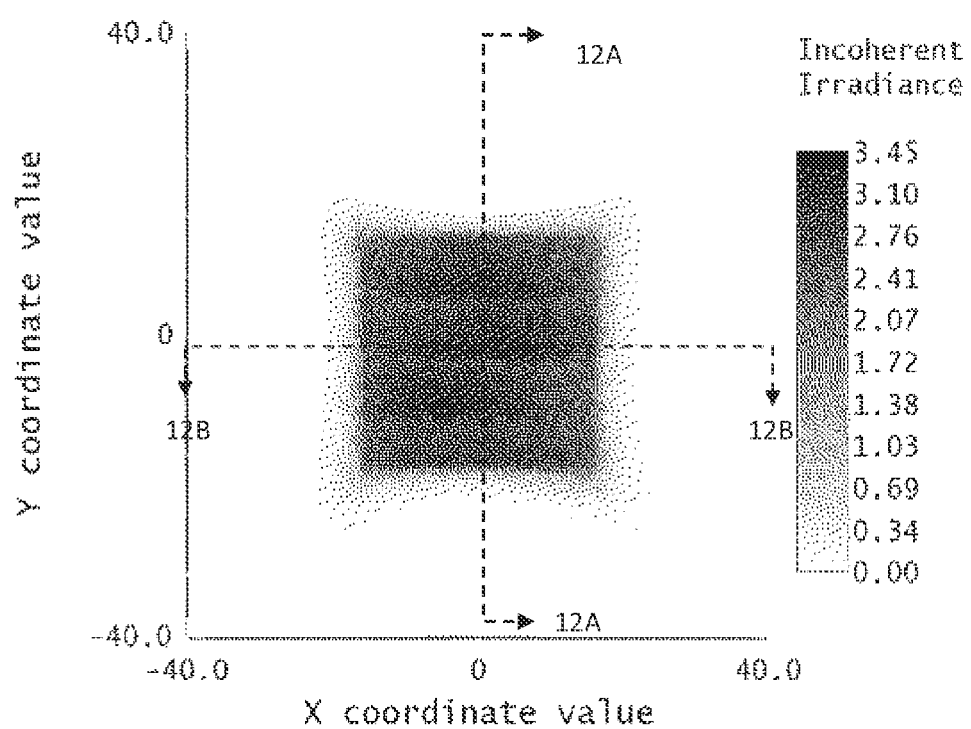
FIG. 12 shows a simulated image resulting from the light-pipe arrangement of FIG. 11.
Figure 13:
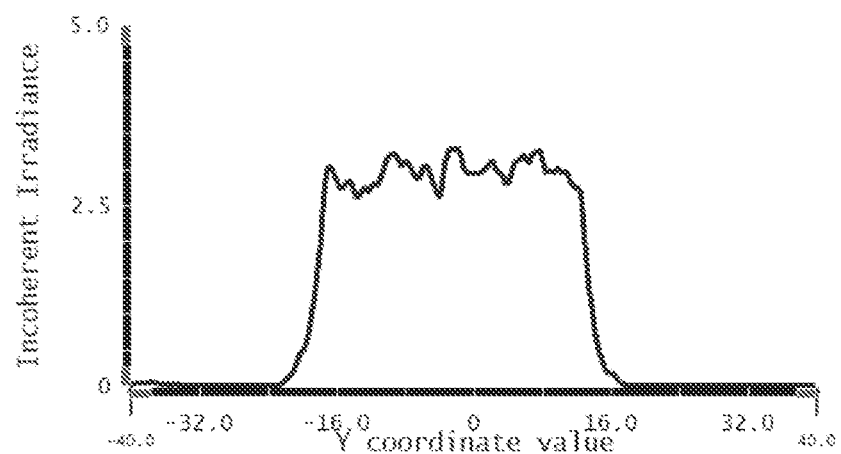
FIG. 13 shows an intensity cross section across section 12A in FIG. 12.
Figure 14:
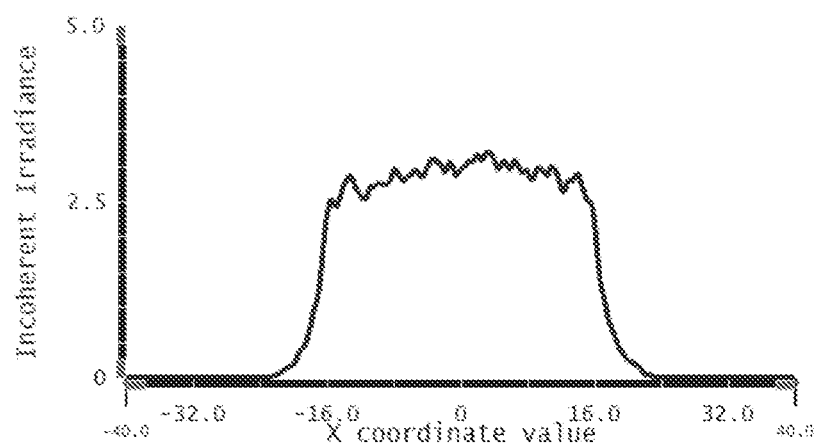
FIG. 14 shows an intensity cross section across section 12B in FIG. 12.

It will be appreciated that if it is desired to further improve the HLR, the number of light pipes may be increased. FIG. 11 shows a four-trapezoid light pipe design. The starting point is the structure shown in FIG. 8, preserving the overall exterior dimensions. Each of the two trapezoids of FIG. 8 is itself divided into two trapezoids. The powers injected into each section from top to bottom have a ratio of 1:1.11:1:26:1.46. In order to adjust the laser power distribution, each section has an independent light source such as a fiber-coupled diode laser with an independent power supply. FIG. 12 shows the simulated image (illuminated area on the sample plane) which is generated by the above mentioned arrangement. The illuminated area is very nearly square and it is very nearly uniformly illuminated. FIG. 13 is the illumination intensity along a vertical cross section of the image profile (at section line 12A) along x=0, modeled by ray tracing. The result shows nearly flat power distribution from top to bottom, and in this context "flat" is good. The HLR is nearly 1:1 from top to bottom as seen in FIG. 13. The x direction profile on the screen (shown in FIG. 14) reflects the light uniformity on the light pipe exit face. It is always leveled due to its symmetry to the x=0 plane. FIG. 14 gives an example of such a profile at y=0 from FIG. 12B, again derived from ray tracing.

The two or more light pipes could fill out an elliptical cross section, in which case the result could be a circular illumination shape.

It will thus be appreciated that what is provided is a way to illuminate a sample area with very uniform illumination, despite the axis of the optical path of the illumination being oblique to the plane of the sample area. It will also be appreciated that what is provided is a way to illuminate the sample area so as to match the area being addressed by a detection/observation module such as a high-powered microscope. The alert reader will have no difficulty devising myriad obvious variants and improvements upon the invention, all of which are meant to be encompassed within the claims that follow.

The invention claimed is:

1. An illumination apparatus for use with a detection/observation module and for use with a sample area defining a plane, the illumination apparatus having an optical axis, the optical axis being away from normal to the plane and defining an oblique angle relative to the normal axis, the illumination apparatus comprising at least first and second light pipes, each of the first and second light pipes having a predetermined cross section, the first and second light pipes adjacent to each other, the at least first and second light pipes together comprising a combined cross section that is trapezoidal, the trapezoidal combined cross section defining first and second parallel faces, the first parallel face likewise being a face of the first light pipe, the second parallel face likewise being a face of the second light pipe, the first parallel face being shorter than the second parallel face, the adjacency of the first and second light pipes defining a boundary therebetween, the boundary lying between the first and second parallel faces, each of the first and second light pipes having a first end along its axis and a second end along its axis, each of the first and second light pipes illuminated solely at its first end by a respective first and second light source, the first and second light sources providing non-identical power levels of light to their respective first and second light pipes, the first light source providing a higher power level of light than the second light source, the illumination apparatus further comprising an imaging lens disposed between the second ends of the light pipes and the sample area, whereby a resulting illuminated area on the plane is substantially square or rectangular.

2. The illumination apparatus of claim 1 whereby a resulting illuminated area on the plane is substantially square.

3. The illumination apparatus of claim 1 whereby a resulting illuminated area on the plane is substantially rectangular.

4. The illumination apparatus of claim 1 wherein the oblique angle is between 30 degrees and 90 degrees.

5. The illumination apparatus of claim 1 wherein the light pipes are comprised of BK7 glass, fused silica glass, or other suitable material.

6. The illumination apparatus of claim 5 wherein the light pipes are comprised of BK7 glass.

7. The illumination apparatus of claim 5 wherein the light pipes are comprised of fused silica glass.

8. The illumination apparatus of claim 1 wherein the each light pipe has an input aperture at its first end and an exit aperture at its second end, and each input aperture and each exit aperture is anti-reflection coated.

9. The illumination apparatus of claim 8 wherein each of the light pipes defines surfaces other than its input aperture and its exit aperture, and said surfaces have high-reflection coating or total internal reflection.

10. The illumination apparatus of claim 8 wherein each of the light pipes defines surfaces other than its input aperture and its exit aperture, and said surfaces have high-reflection coating.

11. The illumination apparatus of claim 1 wherein the respective light sources are diode lasers, fiber coupled diode lasers, or solid-state lasers.

12. The illumination apparatus of claim 1 wherein each light source has its own respective power control.

13. The illumination apparatus of claim 1 wherein the imaging lens is a single-element lens.

14. The illumination apparatus of claim 1 wherein the imaging lens is composed of multiple elements.

15. The illumination apparatus of claim 1 wherein the number of light pipes is at least three, the at least first and second and third light pipes together comprising the combined cross section that is trapezoidal.

16. The illumination apparatus of claim 15 wherein the number of light pipes is at least four, the at least first and second and third and fourth light pipes together comprising the combined cross section that is trapezoidal.

17. An illumination apparatus for use with a detection/observation module and for use with a sample area defining a plane, the illumination apparatus having an optical axis, the optical axis being away from normal to the plane and defining an oblique angle relative to the normal axis, the illumination apparatus comprising at least first and second light pipes, each of the first and second light pipes having a predetermined cross section, the first and second light pipes adjacent to each other, the first and second light pipes together comprising a combined cross section that is elliptical, each of the first and second light pipes having a first end along its axis and a second end along its axis, each of the first and second light pipes illuminated solely at its first end by a respective first and second light source, the first and second light sources providing non-identical power levels of light to their respective first and second light pipes, the illumination apparatus further comprising an imaging lens disposed between the second ends of the light pipes and the sample area, whereby a resulting illuminated area on the plane is substantially circular.

18. The illumination apparatus of claim 17 wherein the oblique angle is between 30 degrees and 90 degrees.

19. A method for use with an illumination apparatus for use with a detection/observation module and for use with a sample area defining a plane, the illumination apparatus having an optical axis, the optical axis being away from normal to the plane and defining an oblique angle relative to the normal axis, the illumination apparatus comprising at least first and second light pipes, each of the first and second light pipes having a predetermined cross section, the first and second light pipes adjacent to each other, the at least first and second light pipes together comprising a combined cross section that is trapezoidal, the trapezoidal combined cross section defining first and second parallel faces, the first parallel face likewise being a face of the first light pipe, the second parallel face likewise being a face of the second light pipe, the first parallel face being shorter than the second parallel face, the adjacency of the first and second light pipes defining a boundary therebetween, the boundary lying between the first and second parallel faces, each of the first and second light pipes having a first end along its axis and a second end along its axis, each of the first and second light pipes illuminated solely at its first end by a respective first and second light source, the first and second light sources providing non-identical power levels of light to their respective first and second light pipes, the illumination apparatus further comprising an imaging lens disposed between the second ends of the light pipes and the sample area, the method comprising causing the first light source provide a higher power level of light than the second light source, whereby the illuminated area is substantially square or rectangular.

20. The method of claim 19 wherein the number of light pipes is at least three.

21. The method of claim 20 wherein the number of light pipes is at least four.

22. The method of claim 19 whereby the illuminated area is substantially square.

23. The method of claim 19 whereby the illuminated area is substantially rectangular.

24. A method for use with an illumination apparatus for use with a detection/observation module and for use with a sample area defining a plane, the illumination apparatus having an optical axis, the optical axis being away from normal to the plane and defining an oblique angle relative to the normal axis, the illumination apparatus comprising at least first and second light pipes, each of the first and second light pipes having a predetermined cross section, the first and second light pipes adjacent to each other, the first and second light pipes together comprising a combined cross section that is elliptical, each of the first and second light pipes having a first end along its axis and a second end along its axis, each of the first and second light pipes illuminated solely at its first end by a respective first and second light source, the first and second light sources providing non-identical power levels of light to their respective first and second light pipes, the illumination apparatus further comprising an imaging lens disposed between the second ends of the light pipes and the sample area, whereby the illuminated area is substantially circular.

* * * * *